(12) United States Patent
Tsujimoto et al.

(10) Patent No.: US 12,354,841 B2
(45) Date of Patent: Jul. 8, 2025

(54) SUBSTRATE PROCESSING DEVICE, SUBSTRATE PROCESSING SYSTEM, CONTROL METHOD FOR SUBSTRATE PROCESSING DEVICE, AND CONTROL METHOD FOR SUBSTRATE PROCESSING SYSTEM

(71) Applicant: Tokyo Electron Limited, Tokyo (JP)

(72) Inventors: Hiroshi Tsujimoto, Miyagi (JP); Ikko Tanaka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 217 days.

(21) Appl. No.: 17/199,001

(22) Filed: Mar. 11, 2021

(65) Prior Publication Data
US 2021/0305030 A1    Sep. 30, 2021

(30) Foreign Application Priority Data

Mar. 27, 2020   (JP) ................................ 2020-058383

(51) Int. Cl.
*H01J 37/32*    (2006.01)
(52) U.S. Cl.
CPC .. *H01J 37/32183* (2013.01); *H01J 37/32091* (2013.01); *H01J 37/32137* (2013.01);
(Continued)
(58) Field of Classification Search
CPC ......... H01J 37/32091; H01J 37/32137–32183; H01J 37/32577; H01J 37/32917; H01J 37/32926; H01J 37/32935; H01J 37/3299; H01J 37/32082; H01J 37/321; H01J 37/32146; H01J 37/32155; H01J 37/32165; H01J 37/32174; H01J 37/32889; H01J 37/32899; H01J 37/32908;
(Continued)

(56) References Cited

U.S. PATENT DOCUMENTS 7,298,128 B2 *  11/2007  Bhutta ..................... H05H 1/46
                                                     324/76.15
7,339,656 B2 *   3/2008  Matsumoto ....... H01L 21/31116
                                                     257/E21.252
(Continued)

FOREIGN PATENT DOCUMENTS

JP          H11-149996 A       6/1999
JP          2015090770 A       5/2015
(Continued)

*Primary Examiner* — Kurt Sweely
(74) *Attorney, Agent, or Firm* — PROCOPIO, CORY, HARGREAVES & SAVITCH LLP

(57) ABSTRACT

Provided is a substrate processing apparatus comprising: a substrate support on which a substrate is mounted; a first radio frequency power supply that outputs first radio frequency power with a first frequency to the substrate support; a second radio frequency power supply that outputs second radio frequency power with a second frequency lower than the first frequency to the substrate support; a sensor that detects reflected waves received from the substrate support and a processor that controls the first radio frequency power supply so that an effective power, which is equal to a difference between the power of the reflected waves detected by the sensor and the output power of the first radio frequency power supply, reaches a set value.

14 Claims, 8 Drawing Sheets

Substrate Processing System 1S

40MHz    400kHz

Substrate Processing Apparatus 1A
40MHz
Setting: 4000W
Reflected: 1665W
Effective: 2335W 40MHz    400kHz Substrate Processing Apparatus 1B
40MHz
Setting: 4000W
Reflected: 1720W
Effective: 2280W

⇩

Controlled So
Effective Power
=2335W

(52) U.S. Cl.
CPC .. *H01J 37/32174* (2013.01); *H01J 37/32935* (2013.01); *H01J 37/32715* (2013.01)

(58) Field of Classification Search
CPC ......... H01J 37/32715; H01L 21/67069; H01L 21/67155–6719; C23C 16/505
See application file for complete search history.

(56) References Cited

U.S. PATENT DOCUMENTS

| | | | |
|---|---|---|---|
| 9,704,692 B2* | 7/2017 | Leeser | G01R 29/08 |
| 9,805,916 B2* | 10/2017 | Konno | H01J 37/32146 |
| 10,264,662 B2* | 4/2019 | Iwata | H01J 37/32091 |
| 2004/0261946 A1* | 12/2004 | Endoh | H01L 21/6831 |
| | | | 156/345.1 |
| 2010/0018648 A1* | 1/2010 | Collins | H01L 21/6833 |
| | | | 156/345.24 |
| 2010/0300622 A1* | 12/2010 | Yatsuda | H01J 37/32642 |
| | | | 156/345.44 |
| 2014/0203821 A1* | 7/2014 | Yamamoto | H01L 22/14 |
| | | | 324/654 |
| 2017/0117869 A1* | 4/2017 | Leeser | H01J 37/32183 |
| 2018/0144945 A1* | 5/2018 | Takahashi | H01L 21/67109 |

FOREIGN PATENT DOCUMENTS

| | | |
|---|---|---|
| JP | 2019-160816 A | 9/2019 |
| KR | 10-2008-0046591 A | 5/2008 |

* cited by examiner

[Fig. 1]
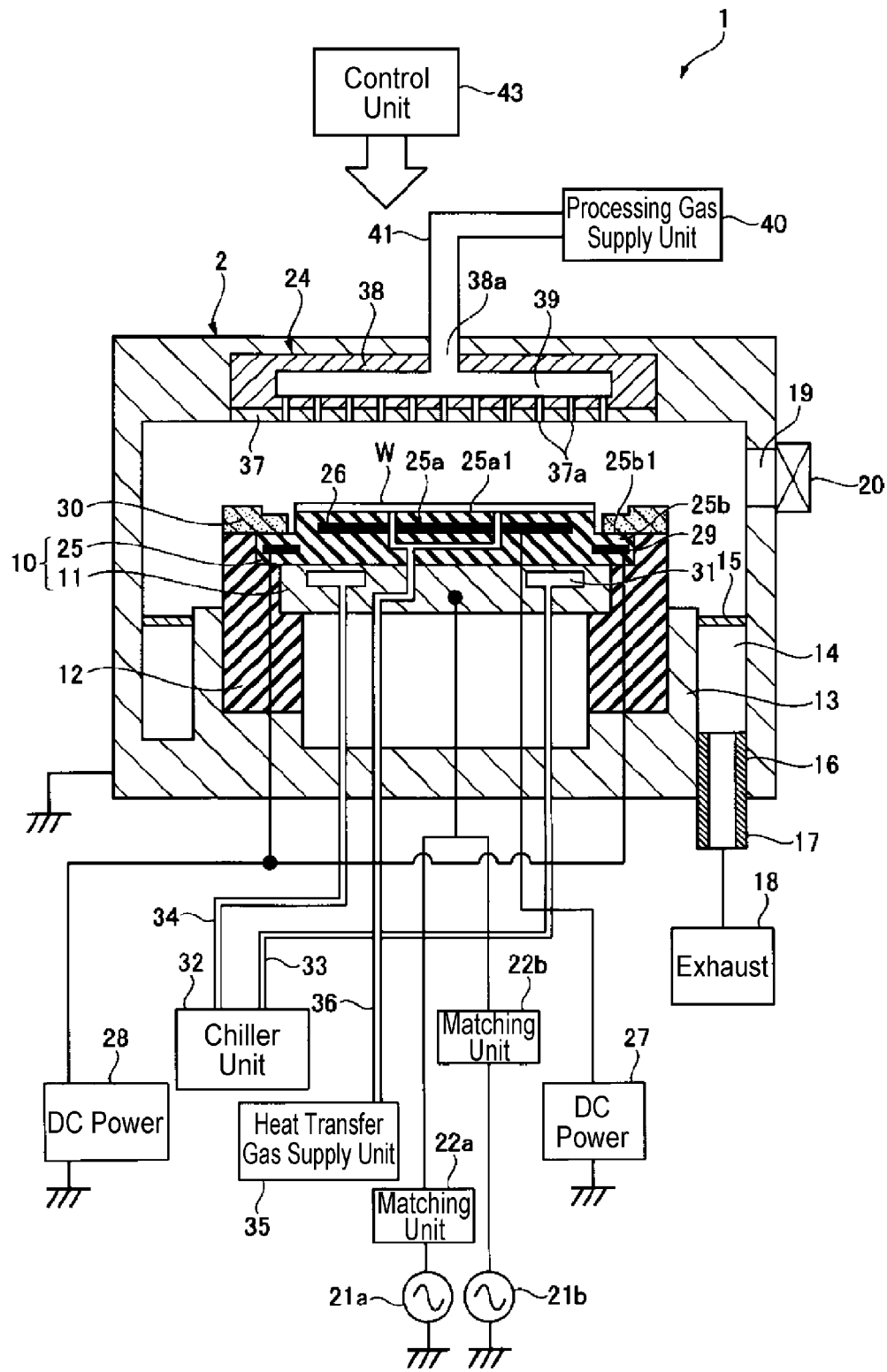

[Fig. 2]
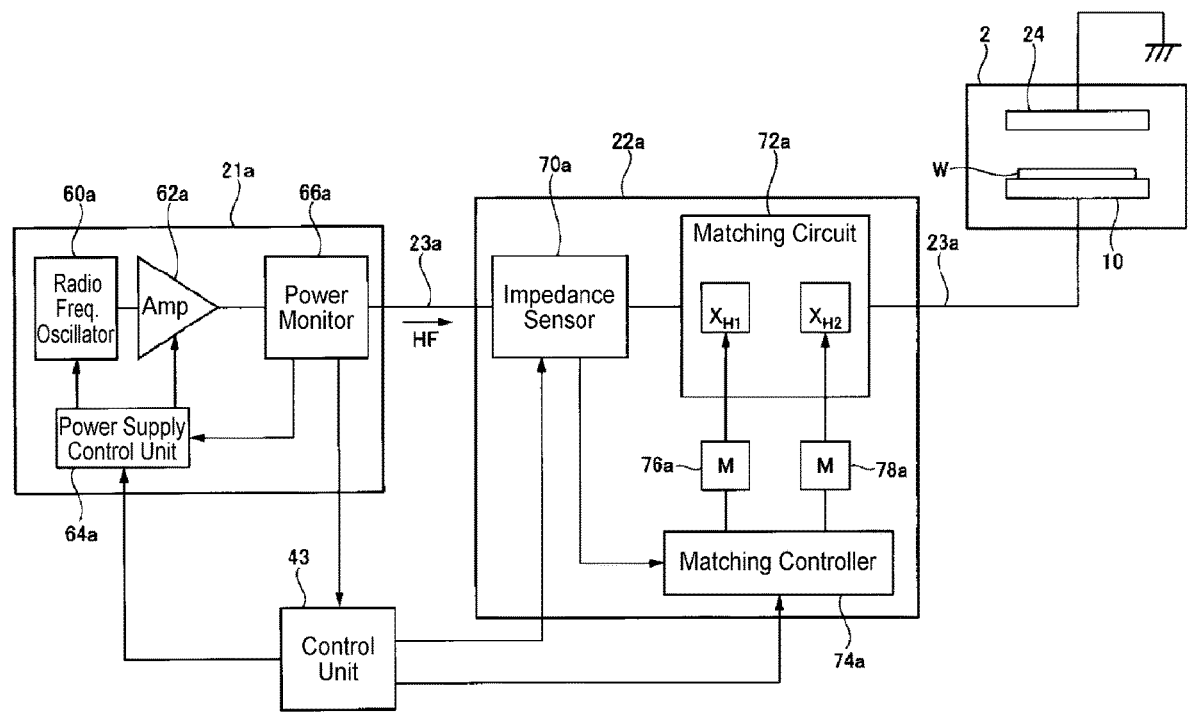

[Fig. 3]
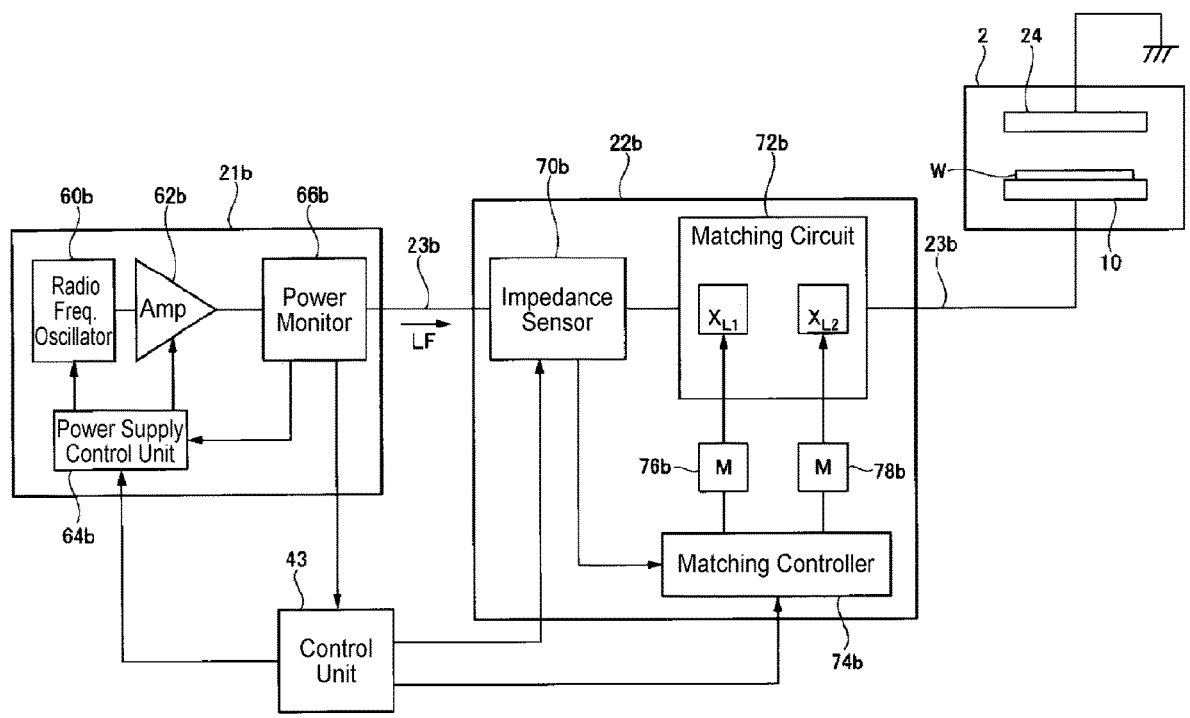

[Fig. 4]
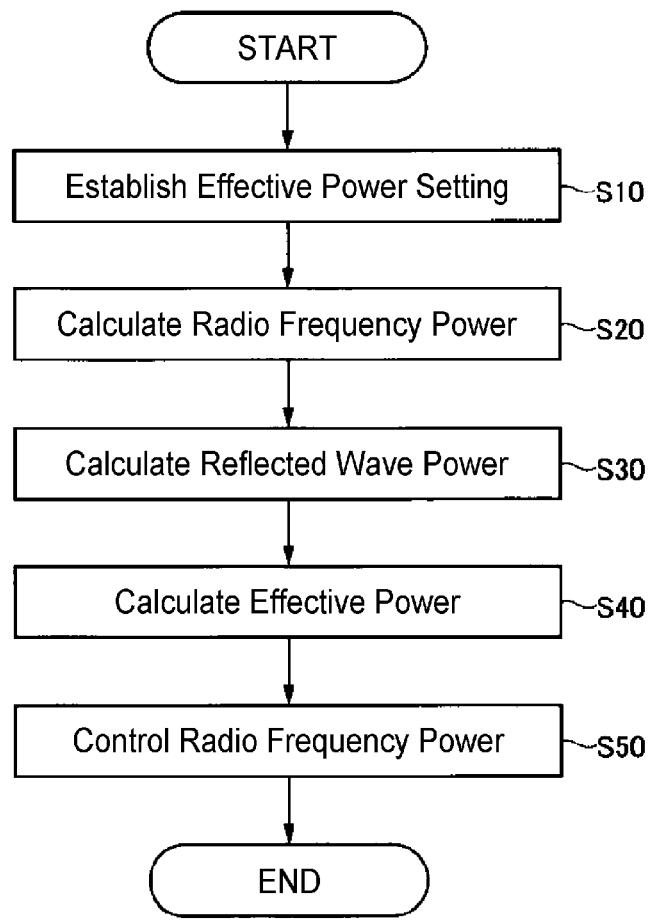

[Fig. 5]
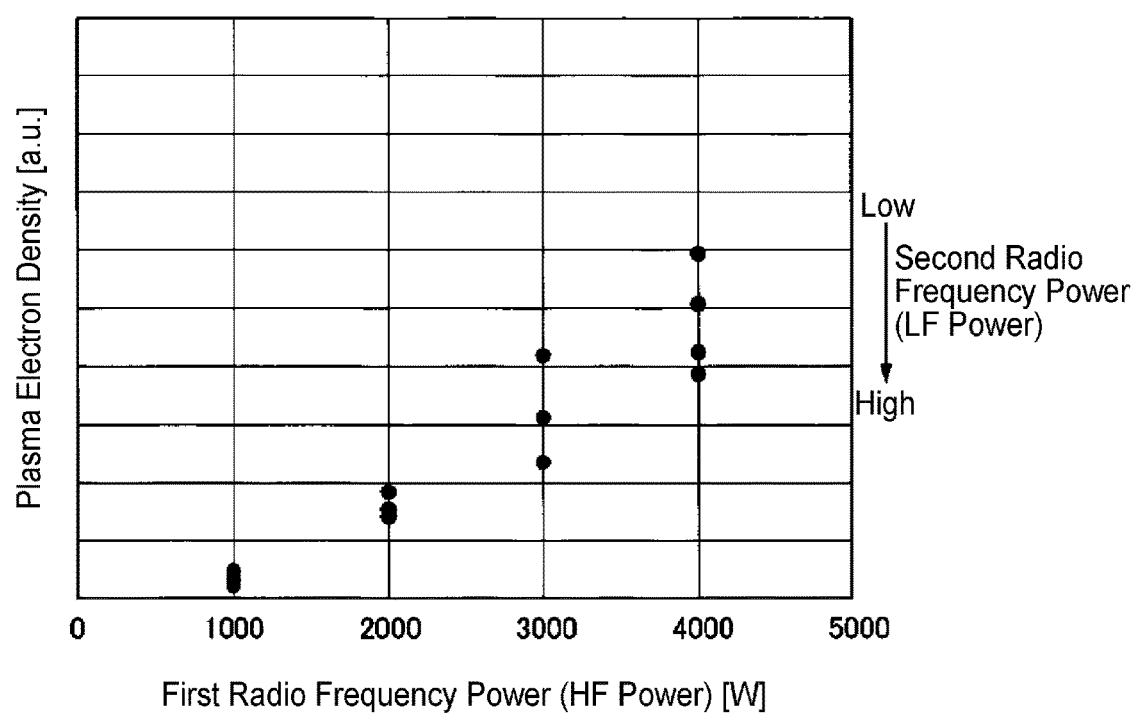

[Fig. 6]
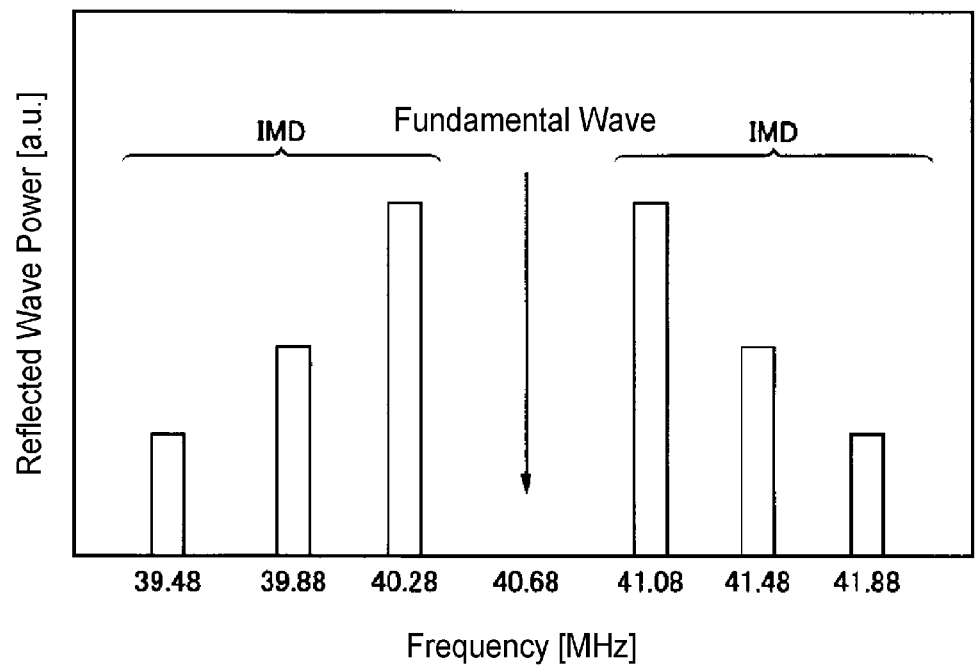

[Fig. 7]
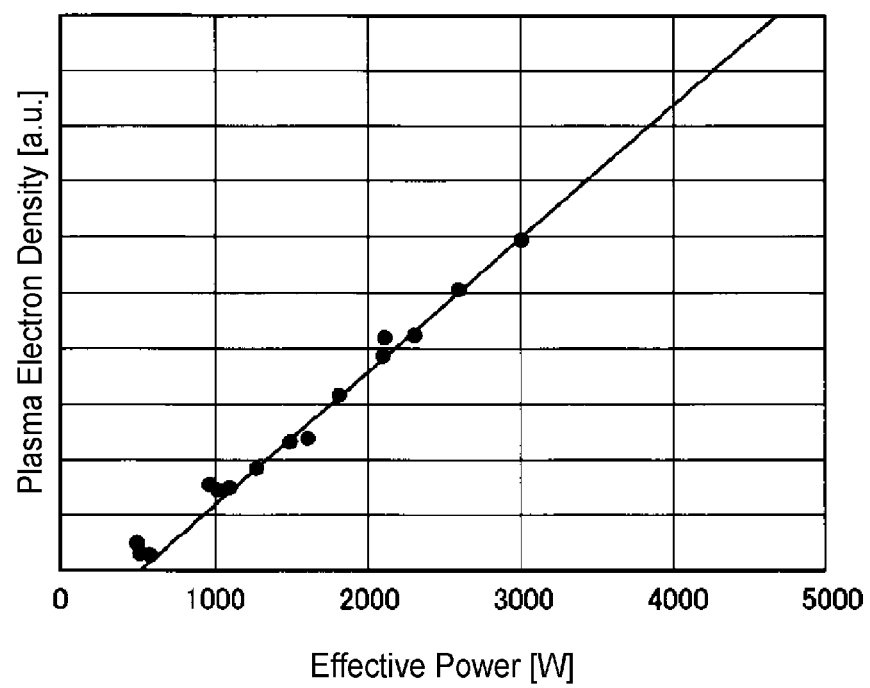

[Fig. 8]
Substrate Processing System 1S
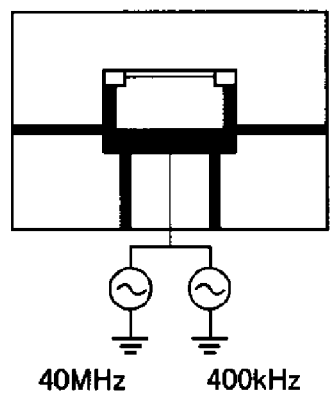
40MHz  400kHz
Substrate Processing Apparatus 1A
40MHz
Setting: 4000W
Reflected: 1665W
Effective: 2335W
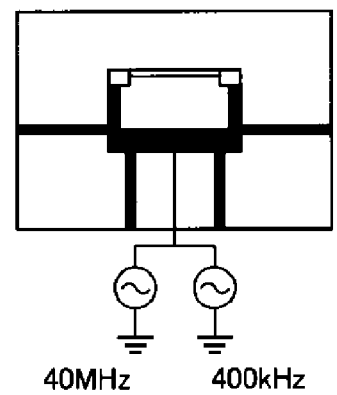
40MHz  400kHz
Substrate Processing Apparatus 1B
40MHz
Setting: 4000W
Reflected: 1720W
Effective: 2280W
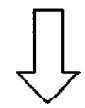
Controlled So
Effective Power
=2335W

SUBSTRATE PROCESSING DEVICE, SUBSTRATE PROCESSING SYSTEM, CONTROL METHOD FOR SUBSTRATE PROCESSING DEVICE, AND CONTROL METHOD FOR SUBSTRATE PROCESSING SYSTEM

BACKGROUND

1. Field

The present disclosure relates to a substrate processing apparatus, a substrate processing system, a control method for a substrate processing apparatus, and a control method for a substrate processing system.

2. Related Art

For example, a plasma etching apparatus has been disclosed in Patent Document 1 that can stably control the load power in a radio frequency power supply.

CITATION LIST

Patent Literature

[Patent Document 1] JP 2015-090770 A

SUMMARY

Problem to be Solved

There is demand for a technology for a plasma etching apparatus that performs processing with the desired processing characteristics based on processing details.

[Aspects for Solving the Problem]

One aspect of the present disclosure provides a substrate processing apparatus comprising: a substrate support on which a substrate is mounted; a first radio frequency power supply that outputs first radio frequency power with a first frequency to the substrate support; a second radio frequency power supply that outputs second radio frequency power with a second frequency lower than the first frequency to the substrate support; a sensor that detects reflected waves received from the substrate support and a processor that controls the first radio frequency power supply so that an effective power, which is equal to a difference between the power of the reflected waves detected by the sensor and the output power of the first radio frequency power supply, reaches a set value.

[Effects]

The present disclosure provides a technology for a plasma etching apparatus that performs processing with desired processing characteristics based on processing details.

BRIEF DESCRIPTION OF THE DRAWINGS

FIG. 1 is a cross-sectional view showing the overall configuration of a substrate processing apparatus according to the present embodiment.

FIG. 2 is a block diagram showing the configuration of the frequency power supply and matching unit for generating plasma in the substrate processing apparatus according to the embodiment.

FIG. 3 is a block diagram showing the configuration of the frequency power supply and matching unit for attracting ions in the substrate processing apparatus according to the embodiment.

FIG. 4 is a flowchart used to explain the processing performed by the control unit in the substrate processing apparatus according to the embodiment.

FIG. 5 is a diagram used to explain the plasma electron density when radio frequency power has been supplied to the substrate processing apparatus according to the embodiment.

FIG. 6 is a diagram used to explain the results of a frequency analysis performed on reflected waves in the substrate processing apparatus according to the embodiment.

FIG. 7 is a diagram used to explain the plasma electron density when radio frequency power has been supplied to the substrate processing apparatus according to the embodiment.

FIG. 8 is a diagram used to explain the adjustment of plasma electron density between apparatus in the substrate processing apparatus according to the embodiment.

DETAILED DESCRIPTION

A mode for embodying the present disclosure will now be described with reference to the drawings. In the present description and drawings, the same reference signs are assigned to configurations that are substantially the same, and redundant explanations of these configurations are omitted.

<Overall Configuration of Substrate Processing Apparatus 1>

An example of the overall configuration of substrate processing apparatus 1 will be described first with reference to FIG. 1. FIG. 1 is a cross-sectional view showing the overall configuration of substrate processing apparatus 1 in the present embodiment. In the explanation of the present embodiment, substrate processing apparatus 1 is a reactive ion etching (RIE) type substrate processing apparatus. Substrate processing apparatus 1 may also be, for example, a plasma etching apparatus or a plasma chemical vapor deposition (CVD) apparatus.

In FIG. 1, substrate processing apparatus 1 can have a grounded cylindrical processing chamber 2 made of a metal such as aluminum or stainless steel with a disk-shaped mounting support 10 on which a substrate W is mounted arranged inside processing chamber 2. Mounting support 10 includes support 11 and electrostatic chuck 25. Support 11 (mounting support 10) functions as a lower electrode. Support 11 can be made of, for example, aluminum. Support 11 is supported by cylindrical support unit 13 extending vertically upward from the bottom of processing chamber 2 via insulating cylindrical holding member 12. Note that mounting support 10 is just one example of a substrate mounting support.

Exhaust passage 14 is formed between the side walls of processing chamber 2 and cylindrical support unit 13. Annular baffle plate 15 is arranged at the entrance to or in the middle of exhaust passage 14, exhaust port 16 is provided in the bottom portion, and exhaust 18 is connected to exhaust port 16 via exhaust pipe 17. Here, exhaust 18 has a dry pump and a vacuum pump, and decompresses the processing space inside processing chamber 2 to a predetermined degree of vacuum. Exhaust pipe 17 also has an automatic pressure control valve ("APC" below) which is a variable butterfly valve, and the APC automatically controls the pressure inside processing chamber 2. Gate valve 20 for opening and closing loading/unloading outlet 19 for substrates W is installed in a side wall of processing chamber 2. First radio frequency power supply 21a is connected to support 11 via first matching unit 22a. Also, second radio frequency power supply 21b is connected to support 11 via second matching unit 22b. First radio frequency power supply 21a supplies radio frequency power for generating plasma to support 11 (mounting support 10) at a predetermined frequency (for example, 40 MHz). Second radio frequency power supply 21b supplies radio frequency power for attracting ions to support 11 (mounting support 10) at a predetermined frequency lower than that of first radio frequency power supply 21a (for example, 400 kHz).

Shower head 24 that also functions as an upper electrode is installed in the ceiling of processing chamber 2. In this way, radio frequency power at two different frequencies is supplied between support 11 (mounting support 10) and shower head 24 by first radio frequency power supply 21a and second radio frequency power supply 21b.

Electrostatic chuck 25 that attracts substrate W by electrostatic attraction is provided on the upper surface of support 11. The electrostatic chuck 25 has a disk-shaped central portion 25a on which substrate W is placed, and annular outer peripheral portion 25b formed so as to surround central portion 25a. Central portion 25a protrudes upward relative to outer peripheral portion 25b in the figure. The upper surface of central portion 25a is substrate mounting surface 25a1 on which substrate W is mounted. The upper surface of outer peripheral portion 25b is edge ring mounting surface 25b1 on which edge ring 30 is mounted. Edge ring mounting surface 25b1 is configured so that mounted edge ring 30 can be mounted around substrate mounting surface 25a1. Edge ring 30 is also called a focus ring. Central portion 25a is formed by interposing electrode plate 26 made of a conductive film between a pair of dielectric films. Direct current power supply 27 is connected electrically to electrode plate 26. Outer peripheral portion 25b is formed by interposing electrode plate 29 made of a conductive film between a pair of dielectric films. Direct current power supply 28 is connected electrically to electrode plate 29.

Direct current power supplies 27, 28 are configured so that the level and polarity of the direct current voltages to be supplied can be changed. Direct current power supply 27 applies direct current voltage to electrode plate 26 under the control of control unit 43 described later. Direct current power supply 28 applies direct current voltage to electrode plate 29 under the control of control unit 43. Electrostatic chuck 25 generates an electrostatic force such as a Coulomb force using the voltage applied to electrode plate 26 from direct current power supply 27, and attracts and holds substrate W on the electrostatic chuck 25 using the electrostatic force. Electrostatic chuck 25 also generates an electrostatic force such as a Coulomb force using the voltage applied to electrode plate 29 from direct current power supply 28, and attracts and holds edge ring 30 on electrostatic chuck 25 using the electrostatic force.

In electrostatic chuck 25 of the present embodiment, the electrostatic chuck for the substrate W and the electrostatic chuck for the edge ring 30 are integrated. However, separate electrostatic chucks for substrate W and edge ring 30 may be used. Here, electrode plate 26 and electrode plate 29 may be configured so as to be interposed between dielectric films isolated from each other. In the present embodiment, electrode plate 29 is a unipolar electrode. However, it may also be a bipolar electrode. When a bipolar electrode is used, edge ring 30 can be attracted and held even when plasma is not generated.

Annular refrigerant chamber 31 extending in the circumferential direction may be provided inside support 11. A refrigerant such as cooling water may be circulated and supplied at a predetermined temperature from chiller unit 32 to refrigerant chamber 31 via pipes 33, 34, with the temperature of the refrigerant used to control the processing temperature of the substrate W on electrostatic chuck 25. Note that a refrigerant is a temperature-regulating medium supplied to and circulating through pipes 33, 34. The temperature-regulating medium may be used not only to cool support 11 and substrate W but to heat them as well.

Heat transfer gas supply unit 35 is connected to electrostatic chuck 25 via gas supply line 36. Heat transfer gas supply unit 35 uses gas supply line 36 to supply a heat transfer gas to the space interposed between central portion 25a of electrostatic chuck 25 and substrate W. A gas with thermal conductivity, such as He gas, is preferably used as the heat transfer gas.

Shower head 24 in the ceiling has electrode plate 37 on the lower surface with a large number of gas vent holes 37a and electrode support 38 detachably supporting electrode plate 37. Buffer chamber 39 is provided inside electrode support 38, and processing gas supply unit 40 is connected to gas introduction port 38a communicating with buffer chamber 39 via gas supply pipe 41.

Each component in substrate processing apparatus 1 is connected to control unit 43. For example, exhaust 18, first radio frequency power supply 21a, second radio frequency power supply 21b, first matching unit 22a, second matching unit 22b, direct current power supply 27, direct current power supply 28, chiller unit 32, heat transfer gas supply unit 35, and processing gas supply unit 40 are connected to control unit 43. Control unit 43 controls each component in substrate processing apparatus 1.

Control unit 43 includes a central processing unit (CPU) and storage device such as memory (not shown), and executes the desired processing on the substrate processing apparatus 1 by reading and executing a program and a processing recipe stored in the storage device. Control unit 43 also performs the electrostatic adsorption processing for electrostatically attracting edge ring 30.

In substrate processing apparatus 1, first, gate valve 20 is opened, substrate W to be processed is loaded in processing chamber 2 and placed on electrostatic chuck 25. Then, in substrate processing apparatus 1, processing gas (such as a mixture consisting of $C_4F_8$ gas, $O_2$ gas, and Ar gas) is introduced into processing chamber 2 from processing gas supply unit 40 at a predetermined flow rate and flow rate ratio, and exhaust 18, for example, sets the pressure inside processing chamber 2 to a predetermined value.

Next, in substrate processing apparatus 1, radio frequency power with different frequencies is supplied from first radio frequency power supply 21a and second radio frequency power supply 21b to support 11 (mounting support 10). In substrate processing apparatus 1, direct current voltage is applied from direct current power supply 27 to electrode plate 26 of electrostatic chuck 25 and substrate W is attracted to electrostatic chuck 25. Also, in substrate processing apparatus 1, direct current voltage is applied from direct current power supply 28 to electrode plate 29 of electrostatic chuck 25 and edge ring 30 is attracted to electrostatic chuck 25. The processing gas discharged from shower head 24 is turned into plasma and substrate W is etched by radicals and ions in the plasma.

<Configuration of First Radio Frequency Power Supply 21a and First Matching Unit 22a for Generating Plasma>

FIG. 2 is a block diagram showing the configuration of first frequency power supply 21a and first matching unit 22a for generating plasma in substrate processing apparatus 1 according to the embodiment.

First radio frequency power supply 21a outputs first radio frequency power HF at a first frequency (for example, 40 MHz) to first matching unit 22a via radio frequency power supply line 23a. First radio frequency power supply 21a includes radio frequency oscillator 60a, power amplifier 62a, power supply control unit 64a, and power monitor 66a.

Radio frequency oscillator 60a is a transmitter that generates sine waves or fundamental waves at a constant frequency suitable for generating plasma (for example, 40 MHz) by radio frequency discharge. Power amplifier 62a is an amplifier that amplifies the power of the fundamental waves output from radio frequency oscillator 60a using a variably controlled gain or amplification factor. Power supply control unit 64a is a control unit that directly controls radio frequency oscillator 60a and power amplifier 62a in accordance with control power from control unit 43.

First radio frequency power supply 21a also includes power monitor 66a. Power monitor 66a includes a directional coupler on radio frequency power supply line 23a. Power monitor 66a detects the traveling wave power PF1 propagating in the forward direction through radio frequency power supply line 23a, that is, from first radio frequency power supply 21a to first matching unit 22a. Power monitor 66a also detects reflected wave power RF1 propagating in the reverse direction through radio frequency power supply line 23a, that is, from first matching unit 22a to first radio frequency power supply 21a. Power monitor 66a outputs detection results to power supply control unit 64a and control unit 43. Power supply control unit 64a uses these detection results for power feedback control. A reflected wave sensor is an example of power monitor 66a. Power monitor 66a may be provided anywhere along radio frequency power supply line 23a located between first radio frequency power supply 21a and support 11 (mounting support 10).

First matching unit 22a matches the impedance of first radio frequency power supply 21a with impedance of support 11 (mounting support 10). First matching unit 22a includes impedance sensor 70a, matching circuit 72a, and matching controller 74a. Impedance sensor 70a is a sensor that measures the impedance on the load side, including the impedance of matching circuit 72a on radio frequency power supply line 23a. Matching circuit 72a is a circuit including a plurality of (such as two) controllable reactance elements (such as variable capacitors or variable inductors) XH1, XH2 connected to radio frequency power supply line 23a. Matching controller 74a controls reactance elements XH1, XH2 via motor (M) 76a and motor 78a, respectively. Matching controller 74a controls motors 76a, 78a so that the output impedance from first radio frequency power supply 21a and the impedance detected by impedance sensor 70a match.

<Configuration of Second Radio Frequency Power Supply 21b and Second Matching Unit 22b for Generating Plasma>

FIG. 3 is a block diagram showing the configuration of second frequency power supply 21b and second matching unit 22b for attracting ions in substrate processing apparatus 1 of the present embodiment.

Second radio frequency power supply 21b outputs second radio frequency power LF at a second frequency (for example, 400 kHz) lower than the first frequency (for example, 40 MHz) to second matching unit 22b via radio frequency power supply line 23b. Second radio frequency power supply 21b includes radio frequency oscillator 60b, power amplifier 62b, power supply control unit 64b, and power monitor 66b.

Radio frequency oscillator 60b is a transmitter that generates sine waves or fundamental waves at a constant frequency suitable for attracting ions (for example, 400 kHz). Power amplifier 62b is an amplifier that amplifies the power of the fundamental waves output from radio frequency oscillator 60b using a variably controlled gain or amplification factor. Power supply control unit 64b is a control unit that directly controls radio frequency oscillator 60b and power amplifier 62b in accordance with control signals from control unit 43.

Second radio frequency power supply 21b also includes power monitor 66b. Power monitor 66b includes a directional coupler on radio frequency power supply line 23b. Power monitor 66b detects traveling wave power PF2 propagating in the forward direction through radio frequency power supply line 23b, that is, from second radio frequency power supply 21b to second matching unit 22b. Power monitor 66b also detects reflected wave power RF2 propagating in the reverse direction through radio frequency power supply line 23b, that is, from second matching unit 22b to second radio frequency power supply 21b. Power monitor 66b outputs detection results to power supply control unit 64b and control unit 43. Power supply control unit 64b uses these detection results for power feedback control. Power monitor 66b may be provided anywhere along radio frequency power supply line 23b located between second radio frequency power supply 21b and support 11 (mounting support 10).

Second matching unit 22b matches the impedance of second radio frequency power supply 21b with the impedance of support 11 (mounting support 10). Second matching unit 22b includes impedance sensor 70b, matching circuit 72b, and matching controller 74b. Impedance sensor 70b is a sensor that measures the impedance on the load side, including the impedance of matching circuit 72b on radio frequency power supply line 23b. Matching circuit 72b is a circuit including a plurality of (such as two) controllable reactance elements (such as variable capacitors or variable inductors) XL1, XL2 connected to radio frequency power supply line 23b. Matching controller 74b controls reactance elements XL1, XL2 via motor (M) 76b and motor 78b, respectively. Matching controller 74b controls motors 76b, 78b so that the output impedance from second radio frequency power supply 21b and the impedance detected by impedance sensor 70b match.

<Control of Substrate Processing Apparatus 1 Based on Processing Details>

Controls performed by substrate processing apparatus 1 in the present embodiment based on processing details will now be explained. Substrate processing apparatus 1 in the present embodiment controls the output power from first radio frequency power supply 21a based on processing details.

FIG. 4 is a flowchart used to explain the processing performed by control unit 43 in substrate processing apparatus 1 according to the present embodiment. The control method used by control unit 43 in substrate processing apparatus 1 will now be explained with reference to FIG. 4.

(Step S10) Control unit 43 performs processing to determine a set value for an effective power required in substrate processing performed by substrate processing apparatus 1. For example, the set value for the effective power required can be determined when a certain type of substrate processing is selected by an operator using an input such as a keyboard. In other words, the set value for the effective power is determined based on details of the processing to be performed by substrate processing apparatus 1. For example, the details of the processing can include a type of a processing gas, flow rate of a processing gas, and/or a type of film to be etched in a process performed in substrate processing apparatus 1. For example, the set value may be for effective power that can obtain a desired etching shape based on experiments conducted in the past. The etching shape can be defined by an aspect ratio of the etching shape, an angle of the etching shape, and/or a bowing of the etching shape. In the substrate processing system including a plurality of substrate processing apparatuses described later, a desired value may be inputted as the effective power setting. Control unit 43 performs controls to oscillate first radio frequency power supply 21a and obtain the set effective power. Substrate processing apparatus 1 then performs the desired substrate processing.

(Step S20) Control unit 43 calculates the power PHF for first radio frequency power HF to be outputted by first radio frequency power supply 21a. Specifically, control unit 43 receives power PF1 of the traveling waves propagating in the forward direction over radio frequency power supply line 23a as detected by power monitor 66a. Control unit 43 then calculates power PHF for first radio frequency power HF using received power PF1 of the traveling waves. Note that power PHF of first radio frequency power HF may also be calculated using a set value for the output power from radio frequency oscillator 60a set by power supply control unit 64a.

(Step S30) Control unit 43 calculates power PR of the reflected waves. Specifically, control unit 43 receives power RF1 of the reflected waves propagating in the reverse direction over radio frequency power supply line 23a as detected by power monitor 66a. Control unit 43 then calculates power PR of the reflected waves using received power RF1 of the reflected waves.

Because first matching unit 22a is used in substrate processing apparatus 1 in an embodiment, power RF1 of the reflected waves detected by power monitor 66a either does not include reflected waves with a first frequency component or includes an amount small enough to be ignored. Therefore, when power PR of the reflected waves is calculated using power RF1 of the reflected waves, the power of the reflected waves at frequencies different from the first frequency is calculated without including the reflected waves in the first frequency component.

Note that when calculating power PR of the reflected waves, control unit 43 may perform calculations using some frequency components in the detection results detected by power monitor 66a. For example, when the first frequency is F1 (Hz) and the second frequency is F2 (Hz), power PR of the reflected waves may be calculated by integrating power RF1 of the reflected waves in the frequency range F (Hz) of Equation 1.

$$F1-F2\times n \leq F \leq F1+F2\times n \quad \text{(Equation 2)}$$

Here, n is an integer.

Here, n can be 2. Specifically, control unit 43 may calculate power PR using power RF1 of the reflected waves in the frequency range extending from the frequency obtained by subtracting the frequency that is twice the second frequency from the first frequency to the frequency obtained by adding the frequency that is twice the second frequency to the first frequency.

Note that F2×n in Equation 2 is an example of the third frequency obtained by multiplying the second frequency by an integer. Therefore, control unit 43 may calculate power PR using power RF1 of the reflected waves in the range from the frequency obtained by subtracting the third frequency from the first frequency to the frequency obtained by adding the third frequency to the first frequency.

(Step S40) Control unit 43 calculates effective power $P_E$ using power $P_{HF}$ of first radio frequency power HF calculated in step S10 and power $P_R$ of the reflected waves calculated in step S20. Specifically, effective power $P_E$ is calculated from the difference between power $P_{HF}$ of first radio frequency power HF and power $P_R$ of the reflected waves as shown in Equation 2.

$$P_E = P_{HF} - P_R \quad \text{(Equation 2)}$$

(Step S50) Control unit 43 controls first radio frequency power supply 21a so that effective power $P_E$ obtained in step S30 is the set value determined in step S10. Specifically, when effective power $P_E$ is lower than the set value, control unit 43 increases the output from first radio frequency power supply 21a so that effective power $P_E$ reaches the set value. Specifically, when effective power $P_E$ is higher than the set value, control unit 43 decreases the output from the first radio frequency power supply 21a so that effective power $P_E$ reaches the set value. First radio frequency power supply 21a can be outputted, for example, by changing the gain of power amplifier 62a.

<Plasma Electron Density when Radio Frequency Power is Supplied in Substrate Processing Apparatus 1>

The results from measuring the plasma electron density when first radio frequency power HF and second radio frequency power LF were supplied to support 11 (mounting support 10) in substrate processing apparatus 1 of the present embodiment will now be described.

The power of both first radio frequency power HF and second radio frequency power LF and the electron density of the plasma when first radio frequency power HF and second radio frequency power LF were supplied were measured in substrate processing apparatus 1 of the present embodiment. In the present measurement, the power for first radio frequency power HF was set to 1000, 2000, 3000, and 4000 W. When first radio frequency power HF was set under each of the conditions described above, the power for second radio frequency power LF was set to 2000, 4000, 6000, and 8000 W, respectively.

FIG. 5 is a diagram showing the plasma electron densities when the radio frequency power HF and second radio frequency power LF were set as described above.

Increasing first radio frequency power HF increases the electron density of the generated plasma. However, at the same first radio frequency power HF, the electron density of the generated plasma decreases as second radio frequency power LF increases.

Here, the reflected waves returning from support 11 (mounting support 10) to first radio frequency power supply 21a will be described. FIG. 6 is a diagram used to explain the results of a frequency analysis performed on reflected waves in substrate processing apparatus 1 according to the embodiment. First radio frequency power HF generated by first radio frequency power supply 21a is supplied to support 11 (mounting support 10) via first matching unit 22a. Impedance matching is performed by first matching unit 22a. At the first frequency 40 MHz (more specifically, 40.68 MHz), which is the frequency of first radio frequency power HF (fundamental waves), the reflected waves are small enough to ignore. However, when first radio frequency power HF and the second radio frequency power LF were supplied at the same time, the waveform of the frequency obtained by adding to or subtracting from the frequency of first radio frequency power HF a frequency that is an integer multiple of the second radio frequency power experiences so-called intermodulation distortion (IMD). Therefore, the reflected waves corresponding to the intermodulation distortion (IMD) were observed in the frequencies obtained by adding to or subtracting from the frequency of first radio frequency power HF a frequency that is an integer multiple of the second radio frequency power.

Intermodulation distortion (IMD) does not contribute to the generation of plasma. The occurrence of intermodulation distortion (IMD) varies from substrate processing apparatus to substrate processing apparatus, so controlling the occurrence of intermodulation distortion (IMD) is difficult.

Therefore, in substrate processing apparatus 1 in the present embodiment, the magnitude of the generated intermodulation distortion (IMD) is detected by power monitor 66a and controls are performed to correct for the portion of the power due to intermodulation distortion (IMD) that does not contribute to plasma generation.

These controls are performed in substrate processing apparatus 1 in the present embodiment using effective power $P_E$. The results from measuring the electron density when controls are performed using (referencing) effective power $P_E$ are shown in FIG. 7. FIG. 7 shows the electron density of the generated plasma relative to the effective power. According to this graph, the electron density of the plasma can be approximated to a linear function of the effective power. Effective power $P_E$ can be used to set the electron density of the generated plasma to the desired density. For example, when the intermodulation distortion (IMD) changes over time, effective power $P_E$ can be used to suppress the change over time in the characteristics of the substrate processing.

<Substrate Processing System>

When substrate processing apparatuses 1 in the present embodiment are used to perform the same processing in parallel on a plurality of production lines, the characteristics of the plasma processing performed in each line can be matched. In other words, in a substrate processing system with a plurality of substrate processing apparatuses 1, the characteristics of the processing performed by each substrate processing apparatus 1 can be brought into agreement.

FIG. 8 is a diagram used to explain the adjustment of processing characteristics in substrate processing system 1S including substrate processing apparatus 1A and substrate processing apparatus 1B performing the same processing.

In this example, first radio frequency power HF for substrate processing apparatus 1A is set to 4000 W. In order to perform under the same processing conditions as substrate processing apparatus 1A, first radio frequency power HF for substrate processing apparatus 1B is set to 4000 W.

However, the power of the reflected waves in substrate processing apparatus 1A is 1665 W due to the influence of intermodulation distortion (IMD). Meanwhile, the power of the reflected waves in substrate processing apparatus 1B is 1720 W. Therefore, the effective power of substrate processing apparatus 1A is 2335 W, and the effective power of substrate processing apparatus 1B is 2280 W. Here, the electron density of the plasma is lower in substrate processing apparatus 1B. In other words, even when the power of first radio frequency power HF matches in both substrate processing apparatus 1A and substrate processing apparatus 1B, the electron density of the plasma differs between the apparatus and the processing characteristics differ as well. Due to the difference in the electron densities of the plasma, the processing characteristics of substrate processing apparatus 1A and substrate processing apparatus 1B are different.

In substrate processing apparatus 1 of the present embodiment, controls are performed using the effective power. Therefore, controls can be performed, for example, on substrate processing apparatus 1B so that its effective power is equal to that of substrate processing apparatus 1A and the electron density of the plasma is brought into agreement between the substrate processing apparatuses. In other words, by having substrate processing apparatus 1A and substrate processing apparatus 1B share the same setting value for effective power, the substrate processing characteristics can be brought into agreement between the apparatuses.

<Operations and Effects>

Substrate processing apparatus 1 in the present embodiment can perform controls based on details of the processing performed by substrate processing apparatus 1. When first radio frequency power HF for generating plasma and second radio frequency power LF for attracting ions are supplied to mounting support 10, intermodulation distortion (IMD) occurs and the effective power supplied to the plasma is reduced. The occurrence of intermodulation distortion (IMD) cannot be controlled, and intermodulation distortion (IMD) varies from substrate processing apparatus to substrate processing apparatus. Therefore, intermodulation distortion (IMD) changes the plasma processing characteristics of each substrate processing apparatus. In substrate processing apparatus 1 of the present embodiment, the effective power is calculated using the power of the reflected waves caused by intermodulation distortion (IMD). By performing controls using the effective power, the desired processing characteristics can be realized based on processing details.

By using the effective power, substrate processing apparatus 1 of the present embodiment can suppress the change over time in the characteristics of the substrate processing even when the intermodulation distortion (IMD) changes over time.

In a substrate processing system with a plurality of substrate processing apparatuses 1 of the present embodiment, the characteristics of the processing performed by each substrate processing apparatus 1 can be brought into agreement. Substrate processing apparatus 1 of the present embodiment can control the electron density of the plasma by using the effective power. Therefore, even when intermodulation distortion (IMD) occurs, the electron density of the plasma can be made the same across a plurality of substrate processing apparatuses. When the electron density is made the same, variations in plasma processing characteristics can be suppressed between substrate processing apparatuses.

The substrate processing apparatus according to the embodiment disclosed herein are provided for illustrative purposes and should not be construed as being limitative in any way. Various modifications and improvements can be made to the embodiment without departing from the spirit and scope of the appended claims. Items mentioned in a plurality of embodiments can be incorporated into or combined with other configurations to the extent that there are no contradictions.

The substrate processing apparatus of the present disclosure can be applied to any type of plasma, including capacitively coupled plasma (CCP), inductively coupled plasma (ICP), apparatuses that generate plasma using microwaves such as plasma generated by a radial line slot antenna (RLSA), electron cyclotron resonance plasma (ECR), and helicon wave plasma (HWP).

KEY TO THE DRAWINGS

1 Substrate processing apparatus
1A Substrate processing apparatus
1B Substrate processing apparatus
1S Substrate processing system
10 Mounting support
21a First radio frequency power supply
21b Second radio frequency power supply
43 Control unit
66a Power monitor

The invention claimed is:

1. A substrate processing apparatus interacting with another substrate processing apparatus that performs a common processing with respect to the substrate processing apparatus, the substrate processing apparatus comprising:
a substrate support on which a substrate is mounted;
a first radio frequency power supply that outputs first radio frequency power with a first frequency to the substrate support;
a second radio frequency power supply that outputs second radio frequency power with a second frequency lower than the first frequency to the substrate support;
a sensor that detects reflected waves received from the substrate support;
a matching circuit that matches an output impedance from the first radio frequency power supply with an impedance detected by the sensor; and
a controller that controls the first radio frequency power supply so that an effective power, which is equal to a difference between a power of the reflected waves detected by the sensor and the output power of the first radio frequency power supply, reaches a set value,
wherein the controller is configured to calculate the effective power using an integrated power of the reflected waves in a range from a fourth frequency to a fifth frequency when the first radio frequency power and the second radio frequency power are supplied at a same time,
wherein a third frequency is an integer multiple of the second frequency,
wherein the fourth frequency is obtained by subtracting the third frequency from the first frequency,
wherein the fifth frequency is obtained by adding the third frequency to the first frequency,
wherein intermodulation distortion in the reflected waves of the substrate processing apparatus is different from the intermodulation distortion in the reflected waves of the another substrate processing apparatus, and
wherein the controller is programmed to compensate the difference in the intermodulation distortion between the reflected waves of the another substrate processing apparatus and the reflected waves of the substrate processing apparatus to adjust an effective power of the another substrate processing apparatus to be equal to the effective power of the substrate processing apparatus.

2. The substrate processing apparatus according to claim 1, wherein the first frequency is 40 MHz and the second frequency is 400 kHz.

3. The substrate processing apparatus according to claim 1, wherein the integer multiple is 2.

4. The substrate processing apparatus according to claim 1, wherein the sensor comprises an impedance sensor.

5. The substrate processing apparatus according to claim 1, wherein the set value is determined based on the effective power so as to obtain an etching shape based on information associated with previous experiments.

6. The substrate processing apparatus according to claim 1, wherein the set value is determined based on one or more of a type of a processing gas, a flow rate of the processing gas, and a type of a film to be etched.

7. The substrate processing apparatus according to claim 1, wherein the sensor is associated with the first radio frequency power supply.

8. A substrate processing system including a plurality of substrate processing apparatuses, each of the apparatuses comprising:
a substrate support on which a substrate is mounted;
a first radio frequency power supply that outputs first radio frequency power with a first frequency to the substrate support;
a second radio frequency power supply that outputs second radio frequency power with a second frequency lower than the first frequency to the substrate support;
a sensor that detects reflected waves received from the substrate support;
a matching circuit that matches an output impedance from the first radio frequency power supply with an impedance detected by the sensor; and
a controller that controls the first radio frequency power supply so that an effective power, which is equal to a difference between a power of the reflected waves detected by the sensor and the output power of the first radio frequency power supply, reaches a set value,
wherein set values of the plurality of substrate processing apparatuses are equal to one another,
wherein the controller is configured to calculate the effective power using an integrated power of the reflected waves in a range from a fourth frequency to a fifth frequency when the first radio frequency power and the second radio frequency power are supplied at a same time,
wherein a third frequency is an integer multiple of the second frequency,
wherein the fourth frequency is obtained by subtracting the third frequency from the first frequency,
wherein the fifth frequency is obtained by adding the third frequency to the first frequency,
wherein intermodulation distortion in the reflected waves of the substrate processing apparatuses is different, and
wherein the controller is programmed to compensate the difference in the intermodulation distortion between the reflected waves of the substrate processing apparatuses to adjust the effective power of one of the substrate processing apparatuses to be equal to each other.

9. The substrate processing system according to claim 8, wherein the first frequency is 40 MHz and the second frequency is 400 kHz.

10. The substrate processing system according to claim 8, wherein the integer multiple is 2.

11. The substrate processing system according to claim 8, wherein each sensor comprises an impedance sensor.

12. The substrate processing system according to claim 8, wherein each set value is determined based on one or more of a type of a processing gas, a flow rate of the processing gas, and a type of a film to be etched.

13. The substrate processing system according to claim 8, wherein each set value is established based on the effective power so as to obtain an etching shape based on information associated with previous experiments.

14. The substrate processing system according to claim 8, wherein each sensor is associated with each respective first radio frequency power supply.

\* \* \* \* \*